(12) United States Patent
Durairaj

(10) Patent No.: US 10,904,048 B2
(45) Date of Patent: Jan. 26, 2021

(54) PULSE WIDTH MODULATED RECEIVER SYSTEMS AND METHODS

(71) Applicant: SanDisk Technologies LLC, Addison, TX (US)

(72) Inventor: Saravanakumar Durairaj, San Jose, CA (US)

(73) Assignee: SanDiskTechnologies LLC, Addison, TX (US)

(*) Notice: Subject to any disclaimer, the term of this patent is extended or adjusted under 35 U.S.C. 154(b) by 0 days.

(21) Appl. No.: 16/421,560

(22) Filed: May 24, 2019

(65) Prior Publication Data
US 2020/0374161 A1    Nov. 26, 2020

(51) Int. Cl.
| | |
|---|---|
| H04L 25/49 | (2006.01) |
| H03K 9/08 | (2006.01) |
| H04L 7/033 | (2006.01) |
| H04L 27/156 | (2006.01) |
| H03K 5/003 | (2006.01) |
| H03K 3/017 | (2006.01) |

(52) U.S. Cl.
CPC ......... H04L 25/4902 (2013.01); H03K 3/017 (2013.01); H03K 5/003 (2013.01); H03K 9/08 (2013.01); H04L 7/0331 (2013.01); H04L 27/1566 (2013.01)

(58) Field of Classification Search
CPC ...... H03B 5/366; H03B 5/124; H03B 5/1253; H03B 5/1278; H03B 5/1296; H03K 3/012; H03K 3/014; H03K 9/08; H03K 3/017; H03L 7/0812; H03L 7/093; H02M 1/096; H04L 25/4902; H04L 7/0331; H04L 7/0812; H04L 7/093; H04L 27/1566

USPC ............... 331/1 A; 365/189.07; 329/312; 327/175, 176
See application file for complete search history.

(56) References Cited

U.S. PATENT DOCUMENTS

| | | | |
|---|---|---|---|
| 8,564,365 B2 | 10/2013 | Dang et al. | |
| 9,203,391 B2 | 12/2015 | Zhu et al. | |
| 9,407,479 B2 | 8/2016 | Lee et al. | |
| 9,425,781 B2 | 8/2016 | Mandy et al. | |
| 2014/0292402 A1* | 10/2014 | Nandy ................ | H03K 9/08 329/312 |

FOREIGN PATENT DOCUMENTS

CN    106951385    7/2017

OTHER PUBLICATIONS

Jain, et al., "A Low Power1.2Gbps Sync-less Integrating PWM Receiver," 2013, , Solid-State Circuits Conference (A-SSCC), Nov. 11, 2013, IEEE Asian, pp. 229-232.

* cited by examiner

*Primary Examiner* — Arnold M Kinkead
(74) *Attorney, Agent, or Firm* — Dickinson Wright PLLC; Steven Hurles

(57) ABSTRACT

A method for improving timing between solid state devices, e.g., in non-volatile memory device is described and includes generating timing signals from the data stream so that the data stream is free from synchronization bits. The PWM data stream is converted from CML to CMOS level. An even decoder decodes the even data signal. An odd decoder decodes the odd signal. The decoders rely on the respective signal, even or odd, to increase past a slower rising signal based on both the odd and even signals to change from a default low state to a high state. The clock signal is derived from edges of the data itself.

18 Claims, 9 Drawing Sheets

PULSE WIDTH MODULATED RECEIVER SYSTEMS AND METHODS

TECHNICAL FIELD

This disclosure relates to memory systems, and in particular, to methods and systems for timing, e.g., pulse width modulated signal timing in the memory system.

BACKGROUND

Memory systems rely on clocks to synchronize data flow therein. However, accurate clocks consume high power. To meet the need for low power consumption in memory applications, some have slowed the clock speed. This is also undesirable disclosure as it slows operation of the memory. Removing a clock is sometimes not desired as low power transmissions of data signals may have significant jitter that can cause data errors. Phase lock loops and delay lock loops are used to correct for jitter in the clock but these require synchronization bits added to the bit stream, which reduces the data rate.

SUMMARY

This disclosure relates generally to memory management systems and methods. An aspect of the disclosed embodiments of the present disclosure include is a method for pulse width demodulation free from sync-bits and other timing signals, while correcting for jitter and accommodating different data rates. The present methods and structures can also reduce power consumption by operating at a reduced rate of operation, e.g., using dual paths at half operation rates. The even and odd paths are separately processed with the clock being derived from the data itself in an example embodiment.

In an aspect of the present disclosure a pulse-width demodulator for non-volatile memory timing includes a first integrator leg to charge to a voltage reference in response to receipt of a differential data signal; a second integrator leg to charge to level with a first signal of the differential data signal being at a first level and output a pulse width modulation voltage; a comparator to receive the voltage reference and the pulse width modulation voltage and to output a low output signal with the pulse width modulation voltage being less than the voltage reference and output a high output signal with the pulse width modulation voltage being greater than the voltage reference; and a pulse width modulation controller to derive a clock signal from the differential data signal free of timing pulses.

In an aspect of the disclosure, the first integrator leg includes a first capacitor being charged by a switched current source that is connected by either the first signal of the differential data signal or a second signal of the differential data signal.

In an aspect of the disclosure, the second integrator leg includes a second capacitor being charged by the switched current source that is connected by the first signal of the differential data signal.

In an aspect of the disclosure, the first capacitor has a first capacitance, wherein the second capacitor has a second capacitance that is less than the first capacitance.

In an aspect of the disclosure, the first capacitance is twice the second capacitance so that the voltage reference rising more slowly than the pulse width modulated voltage.

In an aspect of the disclosure, the pulse width modulation controller includes a flop circuit triggered by a trailing edge of the pulse width modulation signal.

In an aspect of the disclosure, the first capacitor has a first capacitance, wherein the second capacitor has a second capacitance that generally equal to the first capacitance.

In an aspect of the disclosure, the first integrator leg includes a first current source that supplies half the current level compared to a second current source supplying current to the second integrator leg.

In an aspect of the disclosure, the current source supplies half the current to the differential signal includes a first level and a second level in a pulse with a level having a major time determining a digital value of the pulse.

In an aspect of the disclosure, a CML pad is provided to receive an input signal and a CML to CMOS converter to produce the differential data signal.

In an aspect of the disclosure, a pulse-width demodulator includes an even path decoder core receiving a differential input signal and outputting a demodulated even data signal and an odd path decoder core receiving the differential input signal and outputting a demodulated, odd data signal. The even path decoder core includes a first integrator leg to charge to a voltage reference in response to receipt of the differential input signal, a second integrator leg to charge to level with a first signal of the differential data signal being at a first level and output a pulse width modulation even voltage, and a comparator to receive the voltage reference and the pulse width modulation voltage and to output a low output signal with the pulse width modulation even voltage being less than the voltage reference and output a high output signal with the pulse width modulation even voltage being greater than the voltage reference. The odd path decoder core includes a third integrator leg to charge to the voltage reference in response to receipt of the differential input signal, a fourth integrator leg to charge to level with the second signal of the differential data signal being at a first level and output a pulse width modulation odd signal, and a comparator to receive the voltage reference and the pulse width modulation odd voltage and to output a low output signal with the pulse width modulation odd voltage being less than the voltage reference and output a high output signal with the pulse width modulation odd voltage being greater than the voltage reference. A pulse width modulator controller can be provided and configured to receive the differential signal and outputting a clock signal. Sampling and retiming circuitry can be configured to receive the clock signal, the even data signal, and the odd data signal to output a half rate even data signal and a half rate odd data signal.

In an aspect of the disclosure, the pulse width modulator controller includes a flop circuit triggered by the second signal of the differential data signal, which is a negative CMOS signal of the differential input signal.

In an aspect of the disclosure, the sampling and retiming circuitry includes a two delay elements on one of an even data path and an odd data path and one delay element on the other of the even data path and the odd data path, and wherein each delay element is triggered by the inverse of the clock signal.

In an aspect of the disclosure, the even path integrator operates for a first time period and the odd path integrator works for a second time period and the first time period and the second time period are interleaved.

An aspect of the present disclosure includes a method for demodulating a pulse width modulated signal including receiving the pulse width modulation signal, the pulse width modulation signal having first and second levels, wherein the pulse width modulation signal is a differential signal with a positive signal and a negative signal; charging, by a first current source, a first capacitor in response to the pulse width modulation signal changing from the first level to the second level during a first time interval; charging, by a second current source, a second capacitor in response to the negative signal changing from the first level to a third level during the first time interval; and demodulating the pulse width modulation signal for the first time interval based on voltages of the first capacitor and the second capacitor with a comparator outputting a low negative signal when the voltage at the second capacitor being less than the voltage at the first capacitor and outputting a high negative output with the voltage at the second capacitor being greater than the voltage at the first capacitor.

In an aspect of the disclosure, the method includes charging, by the first current source, a third capacitor in response to the pulse width modulation signal changing from the first level to the second level during a second time interval.

In an aspect of the disclosure, the method includes charging, by the second current source, a fourth capacitor in response to the positive signal changing from the first level to a fourth level during the second time interval.

In an aspect of the disclosure, the method includes demodulating the pulse width modulation signal for the second time interval based on voltages of the third capacitor and the fourth capacitor with a second comparator outputting a low positive signal when the voltage at the fourth capacitor being less than the voltage at the third capacitor and outputting a high positive output with the voltage at the fourth capacitor being greater than the voltage at the third capacitor.

In an aspect of the disclosure, the first time interval and the second time interval are successive pulse widths.

In an aspect of the disclosure, the method includes generating a timing clock from edges of the first time interval and the second time interval.

In an aspect of the disclosure, demodulating the pulse width signal further includes applying a clock signal from the timing clock to both the positive signal output and the negative output signal to alternate between output from first interval and the second interval.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Pulse width modulated receiving circuitry and devices are described. Example embodiments use the data stream itself to develop the clock signal without adding synchronization bits in the data stream. Examples of the present receiving circuitry can also use different paths for the odd and even signals so that the decoding cores can operate at a half rate. A pulse width modulation controller can derive the clock signal from the actual data bits.

Figure 1:
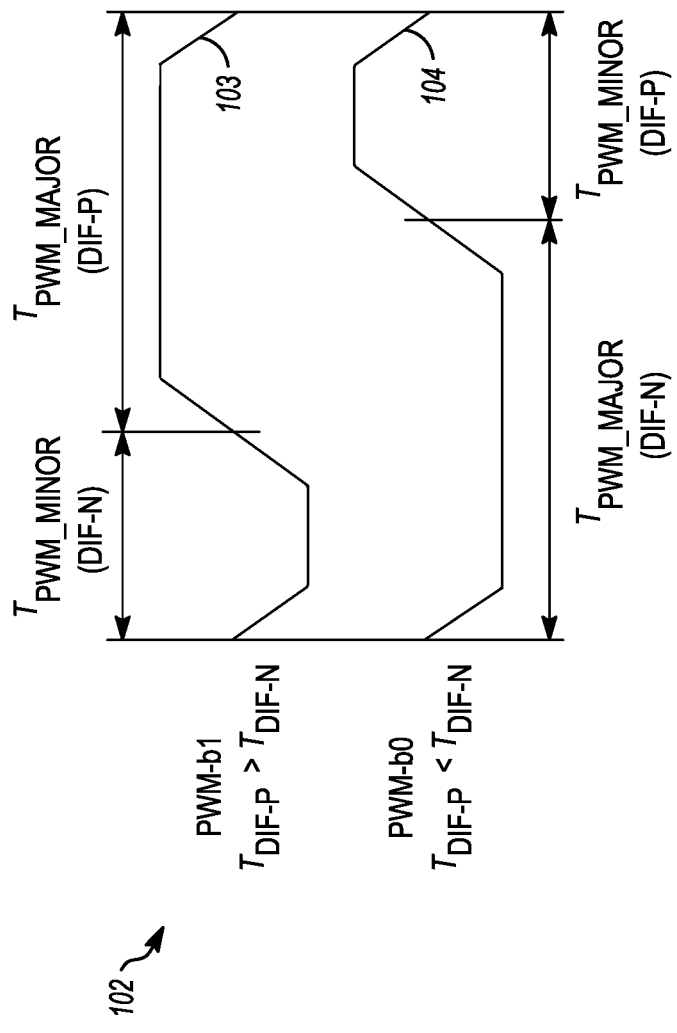
FIG. 1 generally illustrates conventional timing of a memory system.
Figure 1:
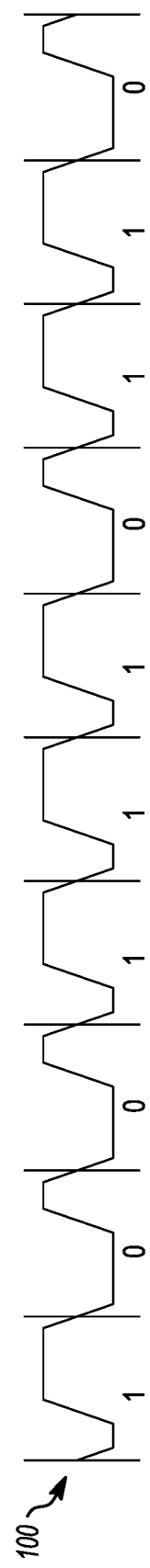

FIG. 1 shows a diagram 100 of a conventional interchip signal using pulse width modulated (PWM) signals, which providing timing information. The signal 101 is sent an a one signal channel and a zero signal channel. The single 100 shows the different data bits in the signal without the timing bits, which are shown at signal 102. Signal 102 includes a bit line one 103 and a bit line zero 104. To achieve low power consumption many inter-chip communication standards, such as MIPI, MPHY or the like, have proposed a low power moderate speed self-clocking Pulse Width Modulated serial data communication (100s of Mbps), with a major pulse and a minor pulse widths encoding a bit. Here, the PWM bit is delimited by the falling/rising edges. A power hungry accurate clock source in transmitter and expensive clock data recovery circuits in the receiver should be avoided to achieve low power. However, the corresponding receiver needs to tolerate a high amount of jitter expected from such low power jittery transmitter. In general, communication between transmitter and receiver is allowed to consist of an additional bit stream with a bit synchronization stream (sync-bits) to aid phase frequency locking of the receiver, in addition to the actual data payload. A phase lock loop or delay lock loop based data recovery requires long sync-bits for locking. Hence, there is payload overhead reducing the link throughput and increasing effective power consumption, e.g., more bits must be decoded. The present disclosure recognizes that a power saving opportunity can be achieved, if sync-bits required for a receiver's phase-frequency locking can be avoided, so that link can enter power save mode quickly after trans-receiving an actual payload signal stream. The use of Pulse Width Modulation (PWM) as a modulation scheme is used in digital communications as the pulse width is modulated between two values, one value for "0" and the other value for "1." The pulse width can also be referred to as the "duty-cycle." The pulse-to-pulse period of the PWM signal can also carry clock information.

Figure 2:
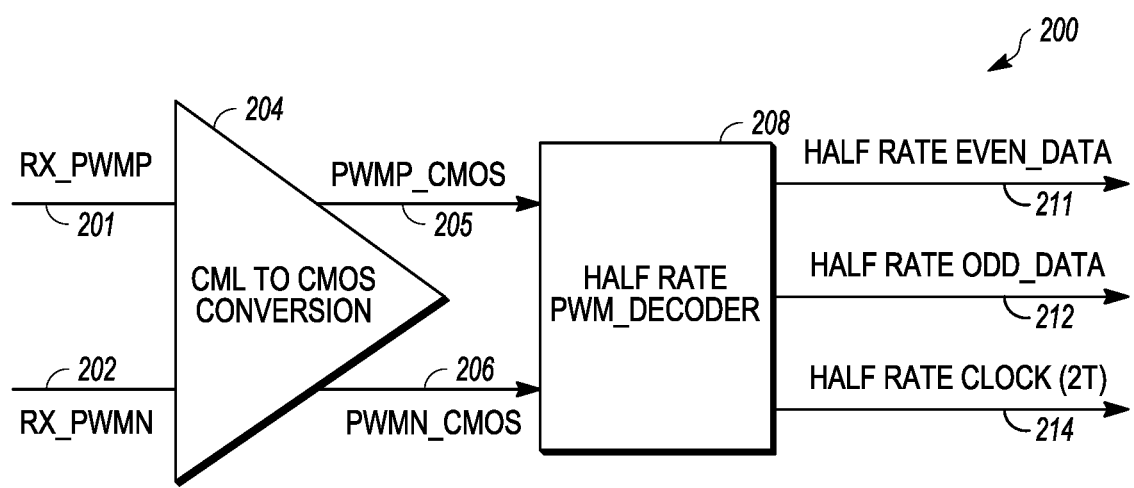
FIG. 2 is a diagram of a half-rate pulse width modulation decoder according to an aspect of the present disclosure.

FIG. 2 shows a schematic diagram of a pulse width modulated (PWM) receiver 200. The received 200 is configured to receive a bit stream from a current-mode logic (CML) level and input the differential signals 201, 202 to a CML to CMOS converter 204. The first differential signal 201 (RX_PWMP) is the received positive signal to which a pulse width modulation has been applied. The second differential signal 202 (RX_PWMN) is the received negative (e.g., the zero signal) signal to which a pulse width modulation has been applied. The use of CML to transmit data to the PWM receiver 200 can be part of a communication for interchip communication in a non-volatile memory system, e.g., NAND systems. CML communication lines and circuitry can provide lower output voltage swings compared to the static CMOS circuits. The CML to CMOS converter 204 can provide very fast current switching at its input differential transistor pairs. The CML to CMOS converter 204 converts the incoming bit stream from the CML level to the CMOS level and outputs differential signals 205, 206 (PWMP_CMOS and PWMN_CMOS, respectively). The differential signals 205, 206 are at the level to be processed at the CMOS (physical) level of a memory system. More specifically, CML to CMOS converter 204 will converts the incoming low Swing/different Common Mode pad signals 201, 202 to a full swing differential signal at 205, 206. The pad signal is the signal at the physical pads connecting the converter to communication traces or lines, interchip in an example embodiment.

A half rate PWM decoder 208 receives the differential signals 205, 206 to decode the signal stream into data decoded to the output data signals 211, 212 and the clock signal 214. Full swing differential signal of CML to CMOS will be driving the Half Rate PWM Demodulator, which will decode the incoming PWM bits to NRZ 1 or 0. Half Rate PWM Demodulator will demodulate the incoming PWM CMOS level signals to a half rate 1's or 0's and also a Half Rate recovered Clock. Since our intention is mainly on to the Half Rate PWM demodulator, will be skipping CML to CMOS. The half rate decoder 208 is used as it requires less power than a full rate decoder. The half rate decoder 208 outputs a first signal 211 representing the half rate even_data, a second signal 212 representing the half rate odd_data, and a half rate clock (2T) signal 214 representing the half of a clock rate, e.g., twice the clock time period.

Figure 3:
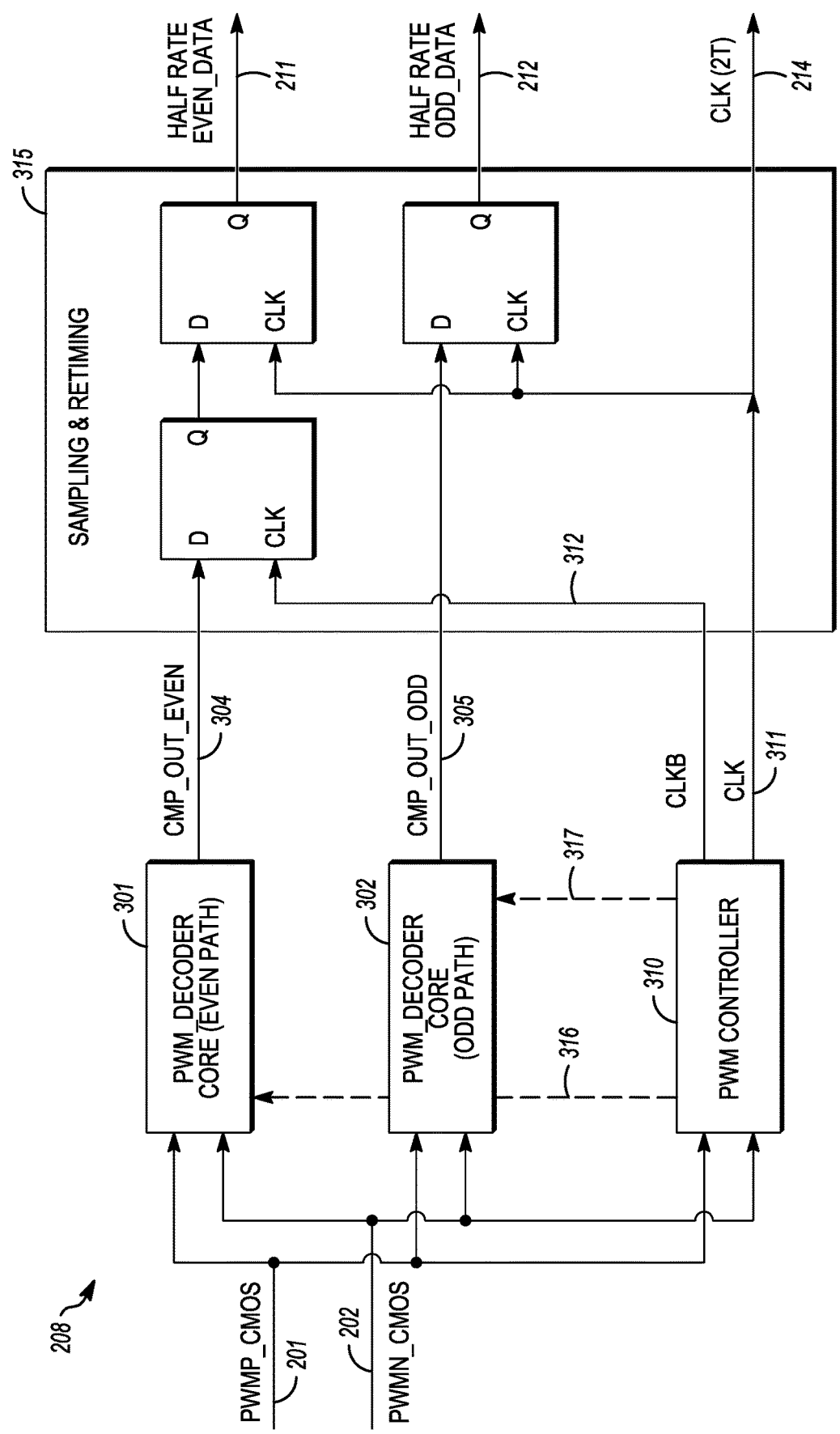
FIG. 3 is a diagram of a half-rate pulse width modulation decoder according to an aspect of the present disclosure.

FIG. 3 shows the half rate decoder 208 in greater detail. The decoder 208 includes more than one decoder cores 301, 302. The decoder core 301 decodes the even path signal from the differential inputs 201, 202 and outputs an even output signal 304. The decoder core 302 decodes the odd path signal from the differential CMOS inputs 205, 206 and outputs an odd output signal 305. The decoder cores 301, 302 operate independently from each other to provide even and odd data demodulation at the same time.

A PWM controller 310 to generate discharge signals for both the odd decoder core 301 and the even decoder core 302 to control the output of from the decoder cores 301, 302. The PWM controller 310 further calculates a clock signal from the incoming data signals 205, 206. A sampling and retiming section 315 receives the clock signal 311 and the clock B signal 312 from the PWM controller 310. The sampling and retiming section retime the demodulated half rate data at 304, 305 with the half rate derived clock 311, 312 from the PWM controller 310. For example, the data at the PWM decoded data at signals 304, 305 can be switched at the output of the sampling and timing section 315 to output full data rate data at 211, 212. The clock signal 311 can be output as the half rate clock signal 214. For example, the retimed half rate even/odd data at 211, 212 is output along with the half rate clock signal 214.

In an example embodiment for a fixed-ratio format, the bit period is fixed, e.g., the time between two falling edges of bits in the incoming data stream. This can be used to generate the clock for the sampling. In an example embodiment, there is an even bit stream and an odd bit stream with one bit decoded at the falling edge of the clock and one bit decoded on the rising edge of the clock, respectively. These bits will get retimed with the rising edge of the clock after PWM decoding. The PWM controller 310 also generates reset signal 316, 317 for the even/odd bit PWM decoder logic cores 301, 302.

Figure 4:
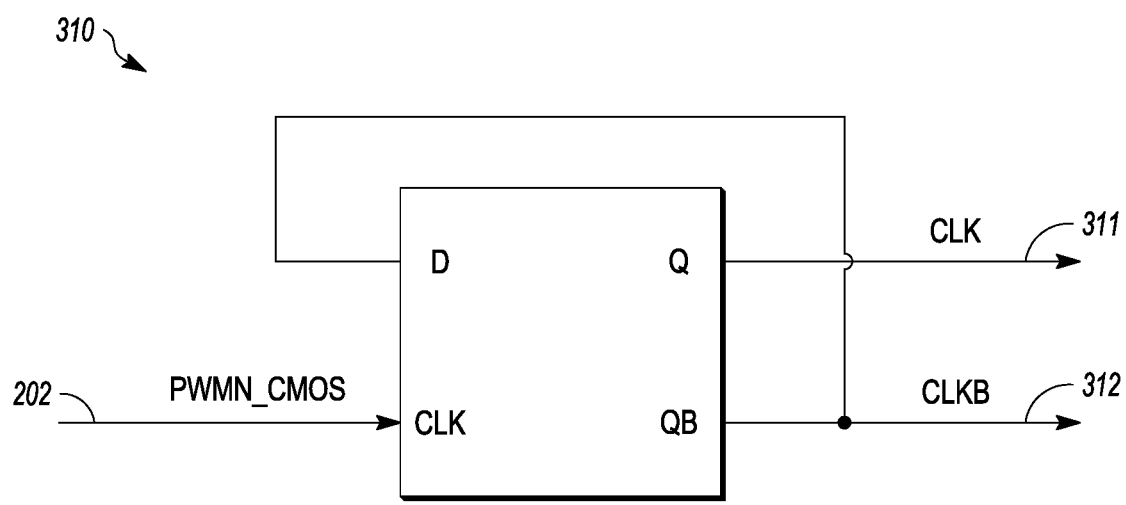
FIG. 4 is a diagram of a pulse width modulation controller according to an aspect of the present disclosure.

FIG. 4 shows an embodiment of the PWM decoder circuitry 310. The PWM decoder circuitry 310 generates the clock signal 311 by using simple divide by two of negative bit stream 202 of the PWM input differential signal 201, 202. The output clock signals 316, 317 can also be used for resetting the PWM decoders.

Figure 5:
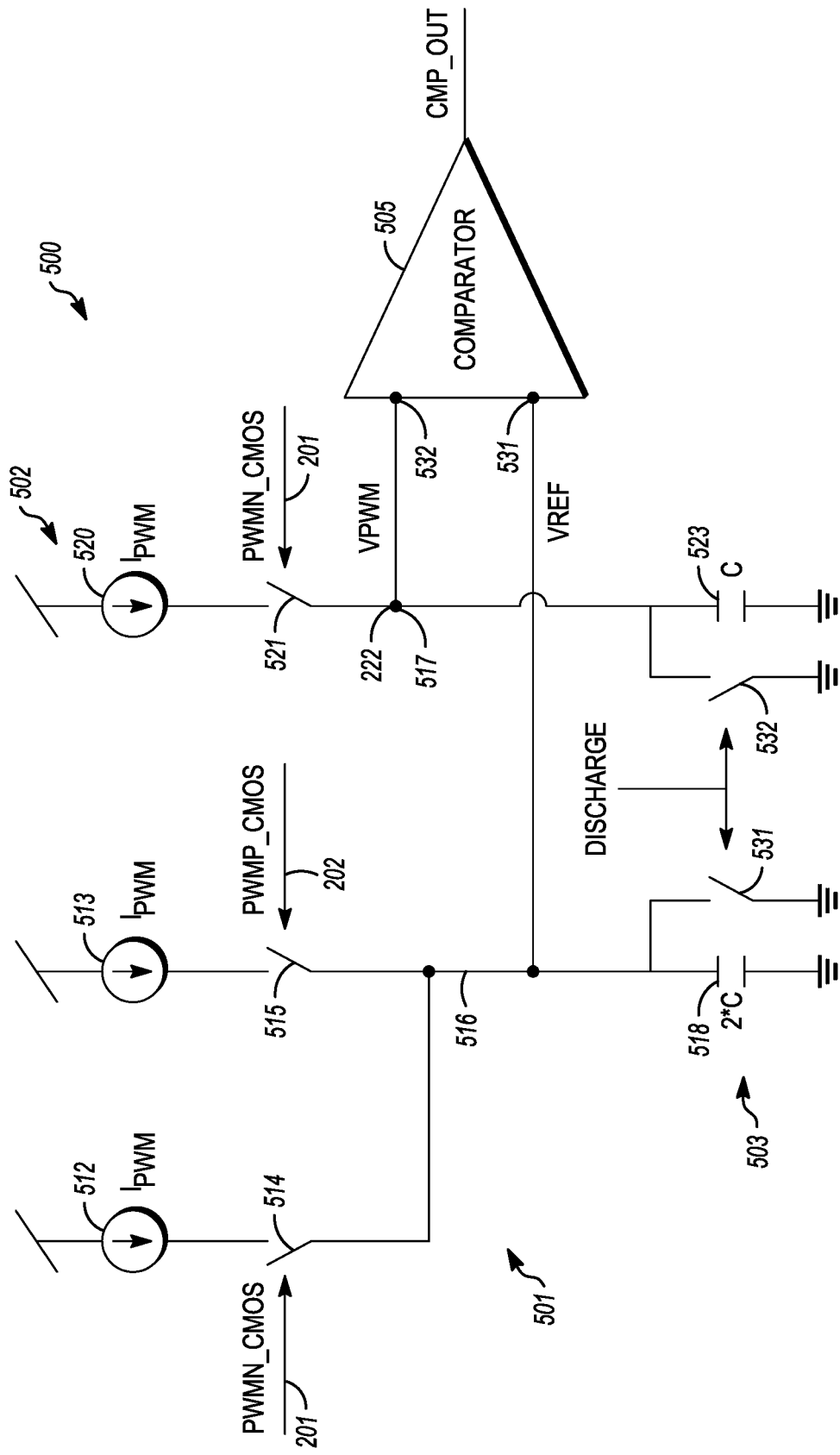
FIG. 5 is a circuit for a pulse width modulation according to an aspect of the present disclosure.

FIG. 5 shows an example embodiment of a PWM decoder core 500. The decoder core 500 will be described as a decoder core for the odd path, but the even path decoder will work in the same manner but will receive the even signal into one of the integrator legs. A first integrator leg 501 is connected in parallel with a second integrator leg 502. Discharge circuitry 503 is connected to both integrator legs 501, 502. A comparator 505 receives outputs from both integrator legs 501, 502 and outputs a decoded data signal, e.g., signal 304 or 305. The first leg 501 is connected to the constant current source in the chip. The current sources are represented at 512 and 513. A normally closed switch 514 is connected between the current source 512 and a node 516 connected to both the discharge circuitry 503 and an input to the comparator 505. The switch 514 is closed and conducting when the signal 201 is high. A normally closed switch 515 is connected between the current source 513 and a node 516. The switch 515 is closed and conducting when the signal 202 is high. As the signal 201 and 202 are differential signals, at least one of the signals 201, 202 is high at all times. Hence, the integrator 501 is charging the capacitor 518 for a complete time period, both the PWM major and the PWM minor times (see e.g., FIG. 1) and provides a rising signal through node 516 to the first input 531 of the comparator 505.

The second leg 502 is connected to the constant current source 520 in the chip. A normally closed switch 521 is connected between the current source 520 and a node 522 connected to both the discharge circuitry 503 and a second input 532 to the comparator 505. The switch 521 is closed and conducting when the signal 201 is high. Thus, the capacitor 523 is charging when signal 201 is high. A rising input is at the second input 532 with signal 201 being high over the time period of a pulse.

The first capacitor 518 has a first capacitance value. The second capacitor 523 has a second capacitance value. The first capacitance value can be greater than the second capacitance value. The first capacitance value can be 1.5 or two times greater than the second capacitance value. This will control the slope of the ramp up of the signals applied to the comparator 505. The signal applied to the comparator second input 531 (e.g., V_ref) will charge for the full time of a pulse width modulated period. The charging of the other integrator leg 502 including switch 521 and capacitor 523 will be shorter than the charging of the first leg 501, which always charges, due to the larger capacitor 518.

The discharging circuitry 503 includes switches 531, 532 in parallel with the first capacitor 518 and the second capacitor 523, respectively. The switches 531, 532 will receive a discharge signal, e.g., at the falling edge of the clock signal and will short the capacitors to ground to discharge the electrical energy stored therein. Upon discharge, the switches 531, 532 open and the integrator legs 501, 502 are reset to integrate over the next PWM pulse time period.

In operation the PWM decoder core 200 includes integrators 501, 502 and followed by comparator 505 which will give decision to the sampler circuitry 315. The sampler include flop circuits. The output of comparator 505 will be sampled with recovered clock. The integrators comprise two legs 501, 502. The first leg 501 will charge for complete period (both PWM_MAJOR/PWM_MINOR) of bits with the first capacitor 518 and current I that will generate the reference voltage (V_ref) for the comparator. The second leg 502 will charge for a positive PWM period (PWMN) with the second capacitor 523 and current I that will generates a window for the incoming signal. The comparator will conduct a voltage comparison of the output from the first leg 501 and second leg 502 to output the required decode logic. A timing diagram is discussed below with regard to FIG. 7 to show the operation in greater detail.

Figure 6:
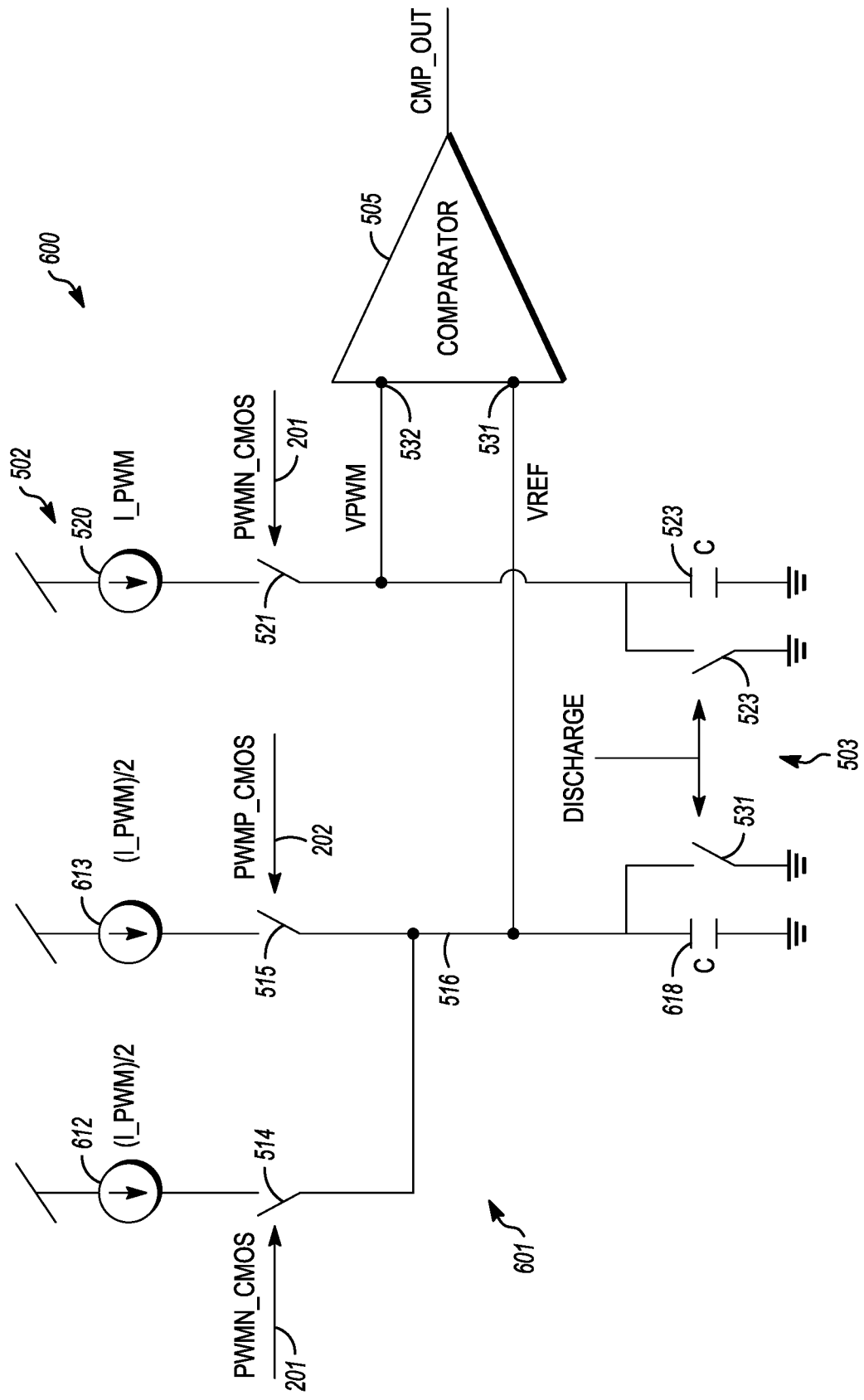
FIG. 6 is a circuit for a pulse width modulation according to an aspect of the present disclosure.

FIG. 6 shows an example embodiment of a PWM decoder core 600, which is similar to the decoder core 500 with the same elements being designated by the same reference numbers. The PWM decoder 600 operates in a similar manner as decoder core 500 but includes reduced current sources 612, 613 and a capacitor 618. The current sources 612, 613 have a lesser current source than the current sources 512, 513. The capacitor 618 has a value less than the capacitor 518. The reduced value current sources 612, 613 and capacitor 618 form the integrator leg 601, which operates in the same manner as the integrator 501.

Figure 7:
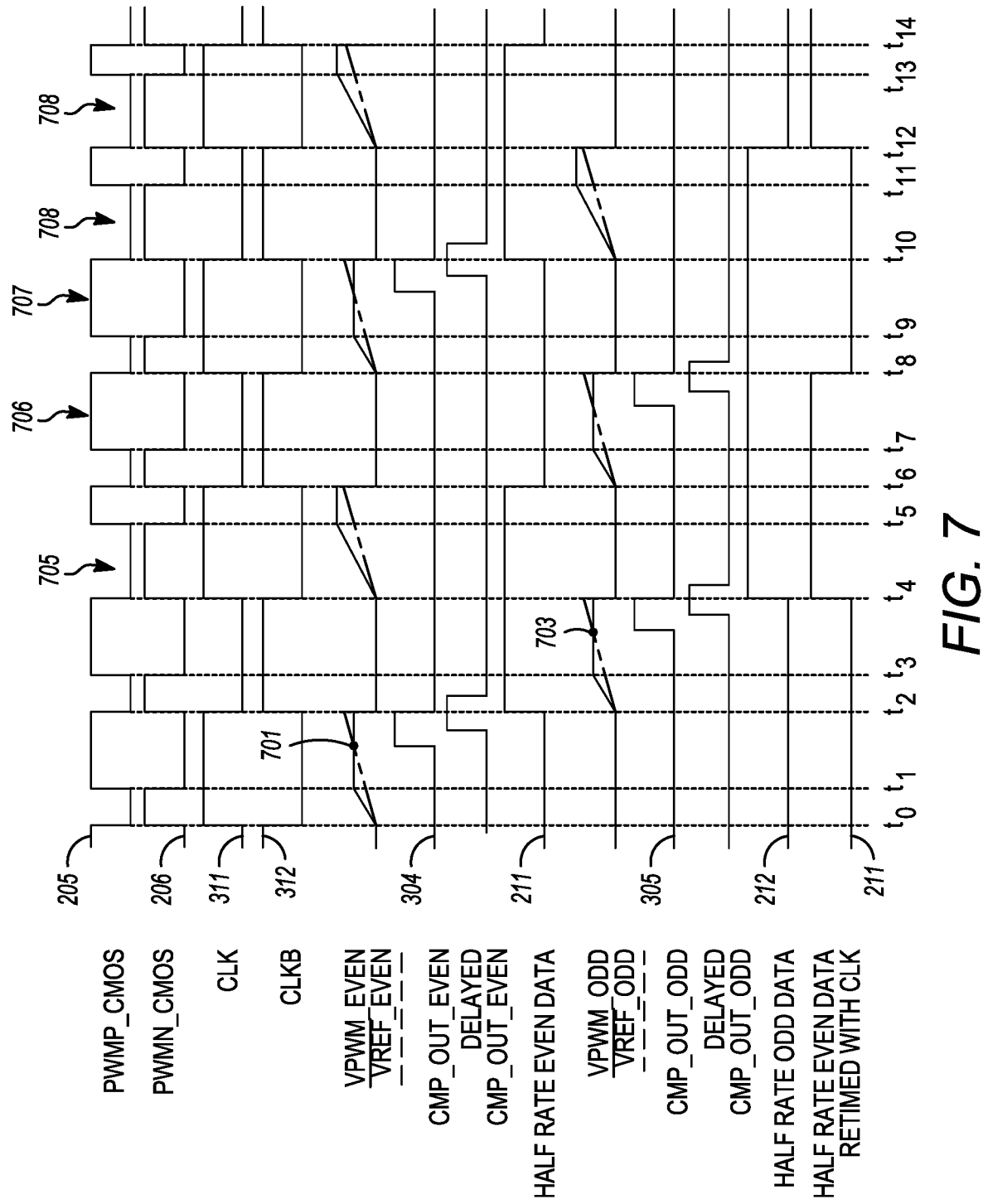
FIG. 7 is a timing diagram according to an aspect of the present disclosure.

FIG. 7 is an operating timing diagram 700 according to an example embodiment.

At $t_0$, the method starts at the negative edge of a data pulse. The positive signal (PWMP_CMOS) of the differential signal drops to zero (low) at $t_0$. The negative signal (PWMN_CMOS) of the differential signal switches to high at $t_0$. The clock 311 is high. The clock B 312 is low.

At time to, the even decoder core 301 is active. The integrator 502 associated with the decoder core 301 begins to charge with the signal at node 517 (the input 532 at comparator 505) and charges to high over the time period $t_0$-$t_1$. The integrator 501 begins to charge with the signal at node 516 (the input 531 at comparator 505) charging to high over the time period $t_0$-$t_2$. At time to, the signal controlling the switch 521 is the PWMP_CMOS. The signal at node 516 (VREF_even) meets and crosses the signal (701) at node 517 (VPWM_even) at which the comparator 505 outputs a high CMP_out (even) signal, intermediate times $t_1$, $t_2$. A delayed CMP_out_even signal is output from comparator 505. The signal 211 is the half_rate even data signal. This signal is held in a part of the sampling and timing 315 and output on the next clock signal, i.e., $t_2$.

At time $t_2$, the odd decoder core 302 is active. The integrator 502 associated with the decoder core 302 begins to charge with the signal at node 517 (the input 532 at comparator 505) and charges to high over the time period $t_2$-$t_3$. The integrator 501 begins to charge with the signal at node 516 (the input 531 at comparator 505) charging to high over the time period $t_2$-$t_4$. The signal at node 516 (VREF_odd) meets and crosses the signal (703) at node 517 (VPWM_odd) at which the comparator 505 outputs a high CMP_out (odd) signal, intermediate times $t_3$, $t_4$. At time $t_2$, the signal controlling the switch 521 is the PWMN_CMOS. A delayed CMP_out_odd signal is output from comparator 505. The signal 212 is the half_rate odd data signal. This signal is held in a part of the sampling and timing 315 and output on the next clock signal, i.e., $t_4$.

This process alternates between processing the even side signal and the odd side signal as shown in diagram 700. The above two cycles of the PWM signal result in a high signal output for the even side and a high signal output for the odd side. The interval 705 between $t_4$-$t_6$ shows that v_ref even does not meet or cross VPWM even. Then the CMP_out_even is low. The interval 706 between $t_6$-$t_8$ shows that v_ref odd does meet and cross VPWM odd. Then the CMP_out_odd is high. The interval 707 between $t_8$-$t_{10}$ shows that v_ref even meets or crosses VPWM even. Then the CMP_out_even is high.

Figure 8:
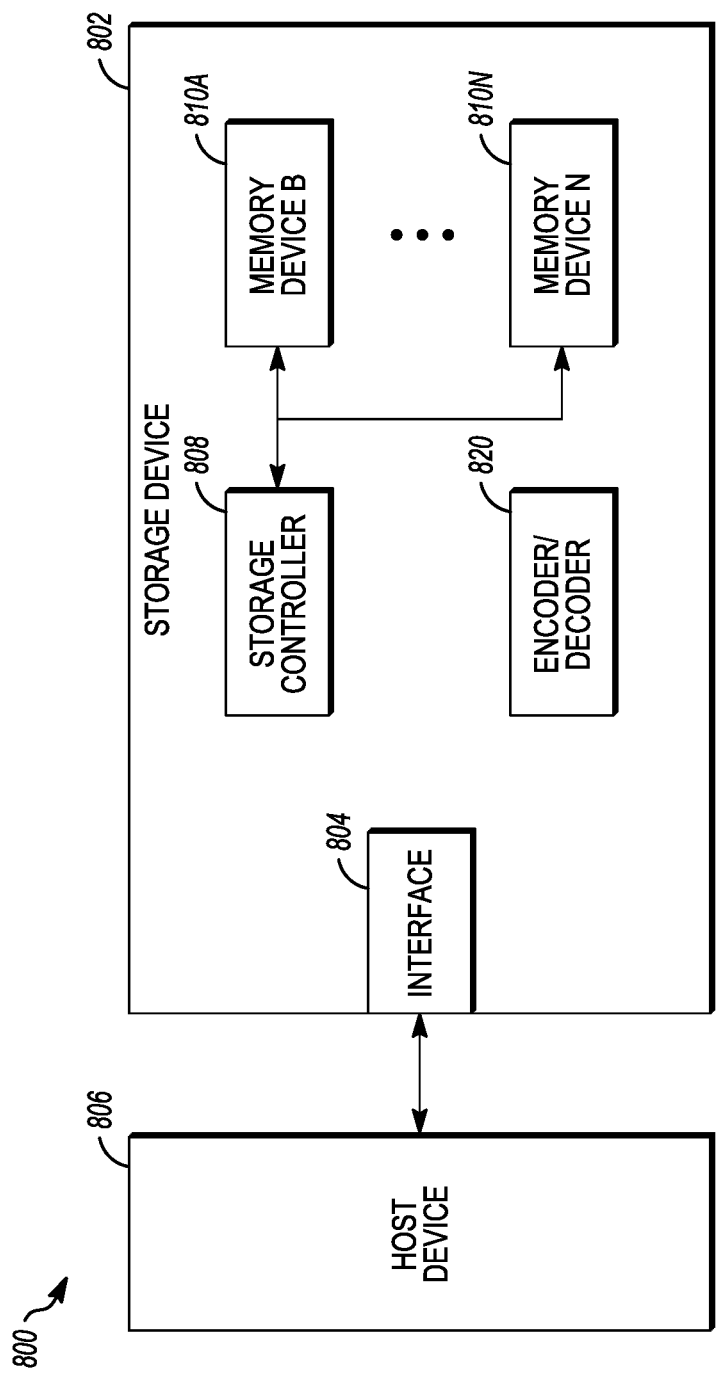
FIG. 8 is an electronic system according to an aspect of the present disclosure.

FIG. 8 generally illustrates a electronic memory arrangement 800 including a host device 806 and a storage device 802. Data may be sent and received through an interface 804 between the host device 806 and the storage device 802. The interface 804 is configured to interface with the host device 806, e.g., to communicate data and/or command requests as provided by the host device 806 for processing by the storage device 802. The interface 804 can include the PWM receiver 200 as described herein. The signals being communicated through the interface may be using self-clock as described herein. The interface may include the pulse width modulation circuitry as described herein. The communication channel between the host interface 806 and the memory device can communicate using CML. A storage controller 808 is provided in the storage device 802 to control either a single memory device 810A or multiple memory devices 810N. In the illustrated embodiments, the storage device 802 may be a single or a number of solid state storage devices (SSDs) for storage of data. In an example embodiment, the encoder/decoder 820 includes the PWM receiver 200 as described herein.

Aspects of the disclosure use the elements/components described in FIG. 8 to enable execution of several methods to utilize pulse width modulated methods and systems described herein, which can lead to lower power consumption and an increase in the tolerance of jitter in the signals sent between chips, e.g., the host device 806 and the storage device 802 or between components in the storage device. The aspects of the disclosure may use structure, found in the signal itself, to enable more tolerant and low power timing.

In many cases, data written to flash memory, such as NAND-based SSDs, has structure to it. The memory devices 810A-810N may be based on flash memory (NAND) technology. The data signal can be used to provide timing to the memory devices 810A-810N. In an example embodiment, the data signal does not require the longer period timing bits to provide timing information. The removal of the long period timing bits can provide greater bandwidth to convey data and or commands in the signal.

Figure 9:
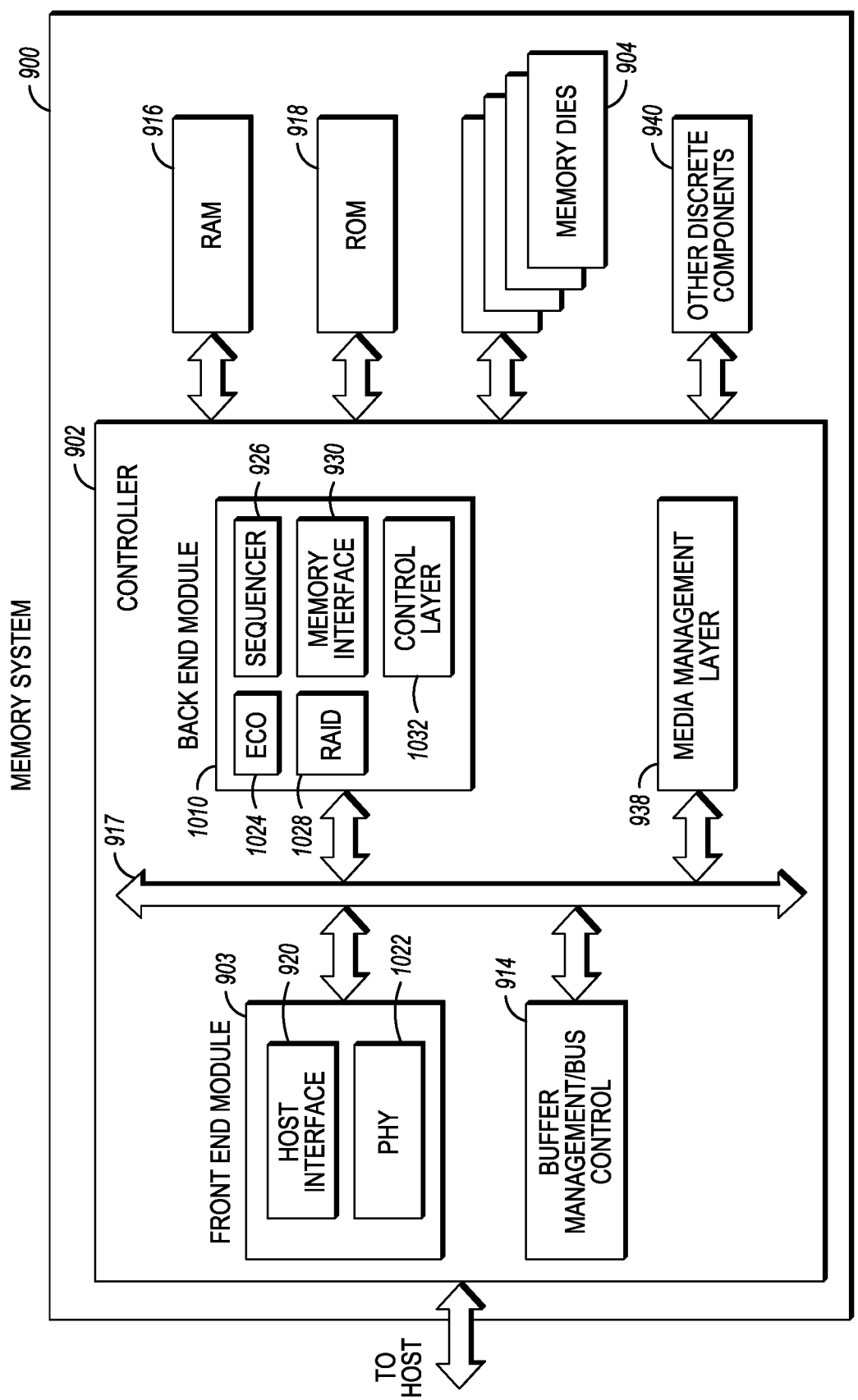
FIG. 9 shows an example non-volatile memory system according to an aspect of the present disclosure.

FIG. 9 shows an example non-volatile memory system 900 illustrating exemplary components of a non-volatile memory controller 902. The controller 902 may include a front end module 908 that interfaces with a host, a back end module 1010 that interfaces with the non-volatile memory die(s) 904, and various other modules that perform various functions of the non-volatile memory system 900. In general, a module may be hardware or a combination of hardware and software, with the software dedicated to the hardware to cause the module to assist in the functioning of the non-volatile memory system 900. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 902 may include a buffer manager/bus controller module 914 that manages buffers in random access memory (RAM) 916 and controls the internal bus arbitration for communication on an internal communications bus 917 of the controller 902. A read only memory (ROM) 918 may store and/or access system boot code. Although illustrated in FIG. 9 as located separately from the controller 902, in other embodiments one or both of the RAM 916 and the ROM 918 may be located within the controller 902. In yet other embodiments, portions of RAM 916 and ROM 918 may be located both within the controller 902 and outside the controller 902. Further, in some implementations, the controller 902, the RAM 916, and the ROM 918 may be located on separate semiconductor dies. The ROM 918 may store one or more the maps described herein for use by the controller 902.

Additionally, or alternatively, the front-end module 908 may include a host interface 920 and a physical layer interface (PHY) 922 that provide the electrical interface with the host or next level storage controller. The choice of the type of the host interface 920 can depend on the type of memory being used. Example types of the host interface 920 may include, but are not limited to, SATA, SATA Express, SAS, Fibre Channel, USB, PCIe, and NVMe. The host interface 920 may typically facilitate transfer for data, control signals, and timing signals.

The back end module 1010 may include an error correction code (ECC) engine or module 924 that encodes the data bytes received from the host, and decodes and error corrects the data bytes read from the non-volatile memory die(s) 904. The backend module 1010 also include a command sequencer 926 that generates command sequences, such as program, read, and erase command sequences, to be transmitted to the non-volatile memory die(s) 904. Additionally, or alternatively, the back end module 1010 may include a RAID (Redundant Array of Independent Drives) module 928 that manages generation of RAID parity and recovery of failed data. The RAID parity may be used as an additional level of integrity protection for the data being written into the non-volatile memory system 900. In some cases, the RAID module 928 may be a part of the ECC engine 924. A memory interface 930 provides the command sequences to the non-volatile memory die(s) 904 and receives status information from the nonvolatile memory die(s) 904. Along with the command sequences and status information, data to be programmed into and read from the non-volatile memory die(s) 904 may be communicated through the memory interface 130. The memory interface 930 can include the PWM methods and circuitry described herein to decode the signal and generate the clock. In one embodiment, the memory interface 930 may be a double data rate (DDR) interface and/or a Toggle Mode 200, 400, 800, or higher interface. A control layer 1032 may control the overall operation of back end module 1010. The backend module 1010 may store the maps and operate to transform the data with the map in a bijection process before encoding for storage on the dies 904. The storage cells on dies may be a source of bit errors that the present disclosure accounts for during the storage of the data files in the memory cells.

Additional modules of the non-volatile memory system 900 illustrated in FIG. 9 may include a media management layer 938 that performs certain memory management functions such as wear leveling of memory cells of the memory dies 904, address management, and facilitates folding operations. Other memory management functions may be possible. Wear of the individual memory cells can be another source of bit errors that the present disclosure can address. The non-volatile memory system 900 may also include other discrete components 940, such as external electrical interfaces, external RAM, resistors, capacitors, or other components that may interface with the controller 902. In alternative embodiments, one or more of the RAID module 928, media management layer 938 and buffer management/bus controller 914 are optional components that may not be necessary in the controller 902.

The PWM circuitry described herein receives and demodulates pulse width modulated (PWM) data signals without requiring synchronization bits in the data stream. The circuitry described herein may consume less power since there is no need to repeatedly synchronize a phase lock loop, a delay lock loop, a counter or other circuitry to the PWM data signal. Furthermore, the PWM receiver circuit tolerantly operates in view of jitter in the frequency of the PWM signal(s) and also to a relatively wide range of intentional variation in the frequency. The circuitry provides for interleaved operation of parallel PWM receiver circuits. In an embodiment current signals are integrated during the duty cycle of the PWM data signal. When the current signals are equal or when the side (positive or negative side) of the differential signal being processed crosses the faster integrating reference, then the signal is a high on that side.

The presently described pulse width modulation methods and systems may accommodate jitter from the transmitting device with the use of the traditional sync-bits. For example, the sync-bits have a longer duration than the data bits and are not required with some of the examples described herein. The present structures and methods do not require a synchronization pattern, e.g., no synchronization bits are needed. The extracted data latency is a single clock cycle. Additionally, the presently described pulse width modulation methods and systems may provide a universal design that works across a wide range of PWM data rate ranges, lower power consumption due to lower rate of operation (e.g., operation at a half rate), and a reduced physical area used for demodulation with the PWM core, controller and simplified digital circuitry.

It is intended that the foregoing detailed description be understood as an illustration of selected forms that the invention can take and not as a definition of the invention. It is only the following claims, including all equivalents that are intended to define the scope of the claimed invention. It is contemplated that elements disclosed in one embodiment may be beneficially utilized on other embodiments without specific recitation. It should be noted that any aspect of any of the preferred embodiments described herein can be used alone or in combination with one another.

What is claimed is:

1. A pulse-width demodulator for non-volatile memory timing, comprising:
    a first integrator leg to charge to a voltage reference in response to receipt of a differential data signal;
    a second integrator leg to charge to a charge level with a first signal of the differential data signal being at a first level and output a pulse width modulation voltage, the charge level being based on an amount of time in which the first signal is at the first level;

a comparator to receive the voltage reference and the pulse width modulation voltage and to output a low output signal with the pulse width modulation voltage being less than the voltage reference and output a high output signal with the pulse width modulation voltage being greater than the voltage reference;

a pulse width modulation controller to derive a clock signal from the differential data signal free of timing pulses; and a current mode logic pad to receive an input signal and a current mode logic to CMOS converter to produce the differential data signal from the input signal.

2. The demodulator of claim 1, wherein the first integrator leg includes a first capacitor being charged by a switched current source that is connected by either the first signal of the differential data signal or a second signal of the differential data signal.

3. The demodulator of claim 2, wherein the second integrator leg includes a second capacitor being charged by the switched current source that is connected by the first signal of the differential data signal.

4. The demodulator of claim 3, wherein the first capacitor has a first capacitance, wherein the second capacitor has a second capacitance that is less than the first capacitance.

5. The demodulator of claim 4, wherein the first capacitance is twice the second capacitance so that the voltage reference rising more slowly than the pulse width modulated voltage.

6. The demodulator of claim 5, wherein the pulse width modulation controller includes a flop circuit triggered by a trailing edge of the pulse width modulation signal.

7. The demodulator of claim 3, wherein the first capacitor has a first capacitance, wherein the second capacitor has a second capacitance that generally equal to the first capacitance.

8. The demodulator of claim 4, wherein the first integrator leg includes a first current source that supplies half the current level compared to a second current source supplying current to the second integrator leg.

9. The modulator of claim 1, wherein the current source supplies half the current to the differential signal includes a first level and a second level in a pulse with a level having a major time determining a digital value of the pulse.

10. A pulse-width demodulator, comprising:

an even path decoder core receiving a differential input signal and outputting a demodulated, even data signal, wherein the even path decoder core includes:

a first integrator leg to charge to a voltage reference in response to receipt of the differential input signal;

a second integrator leg to charge to a charge level with a first signal of the differential data signal being at a first level and output a pulse width modulation even voltage, the charge level being based on an amount of time in which the first signal is at the first level;

a comparator to receive the voltage reference and the pulse width modulation voltage and to output a low output signal with the pulse width modulation even voltage being less than the voltage reference and output a high output signal with the pulse width modulation even voltage being greater than the voltage reference;

an odd path decoder core receiving the differential input signal and outputting a demodulated, odd data signal, wherein the odd path decoder core includes:

a third integrator leg to charge to the voltage reference in response to receipt of the differential input signal;

a fourth integrator leg to charge to another charge level with the second signal of the differential data signal being at a first level and output a pulse width modulation odd signal the another charge level being based on another amount of time in which the second signal is at the first level;

a comparator to receive the voltage reference and the pulse width modulation odd voltage and to output a low output signal with the pulse width modulation odd voltage being less than the voltage reference and output a high output signal with the pulse width modulation odd voltage being greater than the voltage reference;

a pulse width modulator controller receiving the differential signal and outputting a clock signal; and a sampling and retiming circuitry receiving the clock signal, the even data signal, and the odd data signal to output a half rate even data signal and a half rate odd data signal.

11. The modulator of claim 10, wherein the pulse width modulator controller includes a flop circuit triggered by the second signal of the differential data signal, which is a negative CMOS signal of the differential input signal.

12. The modulator of claim 10, wherein the sampling and retiming circuitry includes a two delay elements on one of an even data path and an odd data path and one delay element on the other of the even data path and the odd data path, and wherein each delay element is triggered by the inverse of the clock signal.

13. The modulator of claim 10, wherein the even path integrator operates for a first time period and the odd path integrator works for a second time period and the first time period and the second time period are interleaved.

14. A method for demodulating a pulse width modulated signal, comprising:

receiving the pulse width modulation signal, the pulse width modulation signal having first and second levels, wherein the pulse width modulation signal is a differential signal with a positive signal and a negative signal;

charging, by a first current source, a first capacitor in response to the pulse width modulation signal changing from the first level to the second level during a first time interval;

charging, by a second current source, a second capacitor in response to the negative signal changing from the first level to a third level during the first time interval; and demodulating the pulse width modulation signal for the first time interval based on voltages of the first capacitor and the second capacitor with a comparator outputting a low negative signal when the voltage at the second capacitor being less than the voltage at the first capacitor and outputting a high negative output with the voltage at the second capacitor being greater than the voltage at the first capacitor.

15. The method of claim 14, further comprising:

charging, by the first current source, a third capacitor in response to the pulse width modulation signal changing from the first level to the second level during a second time interval;

charging, by the second current source, a fourth capacitor in response to the positive signal changing from the first level to a fourth level during the second time interval; and demodulating the pulse width modulation signal for the second time interval based on voltages of the third capacitor and the fourth capacitor with a second comparator outputting a low positive signal when the voltage at the fourth capacitor being less than the voltage at the third capacitor and outputting a high positive output with the voltage at the fourth capacitor being greater than the voltage at the third capacitor.

16. The method of claim 15, wherein the first time interval and the second time interval are successive pulse widths.

17. The method of claim 16, further comprising generating a timing clock from edges of the first time interval and the second time interval.

18. The method of claim 17, wherein demodulating the pulse width signal further includes applying a clock signal from the timing clock to both the positive signal output and the negative output signal to alternate between output from first interval and the second interval.

* * * * *